(12) United States Patent
Friedman et al.

(10) Patent No.: US 9,728,636 B2
(45) Date of Patent: Aug. 8, 2017

(54) SYSTEM AND METHOD FOR THRESHOLD LOGIC WITH ELECTROSTATICALLY FORMED NANOWIRE TRANSISTORS

(71) Applicant: Northwestern University, Evanston, IL (US)

(72) Inventors: Joseph S. Friedman, Rochester, NY (US); Alan V. Sahakian, Northbrook, IL (US); Andrey Godkin, Tel Aviv (IL); Alex Henning, Tel Aviv (IL); Yossi Rosenwaks, Hod Hasharon (IL)

(73) Assignees: NORTHWESTERN UNIVERSITY, Evanston, IL (US); RAMOT AT TEL AVIV UNIVERSITY LTD., Tel Aviv (IL)

(*) Notice: Subject to any disclaimer, the term of this patent is extended or adjusted under 35 U.S.C. 154(b) by 21 days.

(21) Appl. No.: 14/672,503

(22) Filed: Mar. 30, 2015

(65) Prior Publication Data
US 2015/0279990 A1   Oct. 1, 2015

Related U.S. Application Data

(60) Provisional application No. 61/973,684, filed on Apr. 1, 2014.

(51) Int. Cl.
| H01L 29/775 | (2006.01) |
| H01L 29/78 | (2006.01) |
| H01L 29/423 | (2006.01) |
| H03K 19/20 | (2006.01) |

(52) U.S. Cl.
CPC .... *H01L 29/7832* (2013.01); *H01L 29/42356* (2013.01); *H01L 29/775* (2013.01); *H03K 19/20* (2013.01)

(58) Field of Classification Search
CPC . H03K 19/20; H01L 29/42356; H01L 29/775; H01L 29/7832
See application file for complete search history.

(56) References Cited

U.S. PATENT DOCUMENTS

| 8,010,591 B2 | 8/2011 | Mojarradi et al. | |
| 2006/0266999 A1* | 11/2006 | Snider | B82Y 10/00 257/23 |
| 2007/0008013 A1 | 1/2007 | Fijany et al. | |
| 2007/0052012 A1* | 3/2007 | Forbes | B82Y 10/00 257/328 |

(Continued)

OTHER PUBLICATIONS

Adrian Bachtold, et al.—Logic Circuits with Carbon Nanotube Transistors—Science—Oct. 4, 2001—vol. 294 pp. 1317 thru 1320.*

(Continued)

*Primary Examiner* — Alexander H Taningco
*Assistant Examiner* — Kurtis R Bahr
(74) *Attorney, Agent, or Firm* — Klintworth & Rozenblat IP LLC (57) ABSTRACT

An electrostatically formed nanowire transistor, includes a source, a drain, and multiple gates surrounding a doped silicon region. The gates include a top gate, a bottom gate, and side gates. The gates induce a channel in said doped silicon region. The channel has a width which is decreased by negative biasing of the side gates, and a height and vertical position controlled by the top and bottom gates.

18 Claims, 9 Drawing Sheets

(56) References Cited

U.S. PATENT DOCUMENTS

| | | | |
|---|---|---|---|
| 2009/0117741 A1* | 5/2009 | Heath | B82Y 10/00 438/694 |
| 2009/0294805 A1 | 12/2009 | Shalev et al. | |
| 2010/0072460 A1* | 3/2010 | Bjoerk | B82Y 10/00 257/24 |
| 2010/0155702 A1* | 6/2010 | Wernersson | B82Y 10/00 257/24 |
| 2011/0233617 A1* | 9/2011 | Or-Bach | H01L 21/76254 257/202 |
| 2012/0161207 A1* | 6/2012 | Homyk | B82Y 10/00 257/253 |
| 2013/0267046 A1* | 10/2013 | Or-Bach | H01L 27/088 438/14 |
| 2013/0313524 A1* | 11/2013 | De Micheli | H01L 29/775 257/29 |
| 2014/0225646 A1* | 8/2014 | Pickett | G11C 8/10 326/105 |

OTHER PUBLICATIONS

Josh Goldberger, et al.—Silicon Vertically Integrated Nanowire Field Effect Transistors, Nano Letters 2006 vol. 6, No. 5 pp. 973-977.*

M. Chiang, et al., "Novel High-Density Low-Power Logic Circuit Techniques Using DG Devices," IEEE Trans. Electron Devices, 2005.

Fijanu, et al., "The G4-FET: a universal and programmable logic gate," Proc. IEEE/ACM GLSVLSI, 2005.

Hampel et al., "Threshold logic," IEEE Spectrum May 1971:32-39.

* cited by examiner

| FG (V) | BG (V) | JG1 (V) | JG2 (V) | Drain Source Current (A) | Resistance (Ω) | Weighted Sum |
|---|---|---|---|---|---|---|
| -3 | -3 | -3 | -3 | 2.85E-19 | 1.76E+17 | 5 |
| -3 | -3 | 0 | -3 | 4.97E-19 | 1.01E+17 | 4 |
| -3 | -3 | -3 | 0 | 7.39E-19 | 6.76E+16 | 4 |
| -3 | 0 | -3 | -3 | 2.31E-18 | 2.16E+16 | 4 |
| -3 | 0 | 0 | -3 | 3.84E-14 | 1.30E+12 | 3 |
| 0 | -3 | -3 | -3 | 7.89E-14 | 6.34E+11 | 3 |
| -3 | 0 | -3 | 0 | 5.23E-13 | 9.56E+10 | 3 |
| -3 | -3 | 0 | 0 | 2.10E-12 | 2.39E+10 | 3 |
| -3 | 0 | 0 | 0 | 7.97E-09 | 6.28E+06 | 2 |
| 0 | -3 | 0 | -3 | 2.83E-08 | 1.77E+06 | 2 |
| 0 | -3 | -3 | 0 | 2.88E-08 | 1.74E+06 | 2 |
| 0 | 0 | -3 | -3 | 2.17E-07 | 2.31E+05 | 2 |
| 0 | -3 | 0 | 0 | 2.98E-07 | 1.68E+05 | 1 |
| 0 | 0 | -3 | 0 | 4.07E-07 | 1.23E+05 | 1 |
| 0 | 0 | 0 | -3 | 4.67E-07 | 1.07E+05 | 1 |
| 0 | 0 | 0 | 0 | 5.89E-07 | 8.49E+04 | 0 |

| A | | B | | C | | D | | EFN Resistance (Ω) | Weighted Sum | | OUT | ROW |
|---|---|---|---|---|---|---|---|---|---|---|---|---|
| 1 | -3V | 1 | -3V | 1 | -3V | 1 | -3V | 1.76E+17 | 5 | 1 | 3.00 V | 1 |
| 1 | -3V | 1 | -3V | 1 | -3V | 0 | 0V | 6.76E+16 | 4 | 1 | 3.00 V | 2 |
| 1 | -3V | 1 | -3V | 0 | 0V | 1 | -3V | 1.01E+17 | 4 | 1 | 3.00 V | 3 |
| 1 | -3V | 1 | -3V | 0 | 0V | 0 | 0V | 2.39E+10 | 3 | 1 | 2.95 V | 4 |
| 1 | -3V | 0 | 0V | 1 | -3V | 1 | -3V | 2.16E+16 | 4 | 1 | 3.00 V | 5 |
| 1 | -3V | 0 | 0V | 1 | -3V | 0 | 0V | 9.56+10 | 3 | 1 | 2.99 V | 6 |
| 1 | -3V | 0 | 0V | 0 | 0V | 1 | -3V | 1.30E+12 | 3 | 1 | 3.00 V | 7 |
| 1 | -3V | 0 | 0V | 0 | 0V | 0 | 0V | 6.28E+06 | 2 | 0 | 0.05 V | 8 |
| 0 | 0V | 1 | -3V | 1 | -3V | 1 | -3V | 6.34E+11 | 3 | 1 | 3.00 V | 9 |
| 0 | 0V | 1 | -3V | 1 | -3V | 0 | 0V | 1.74E+06 | 2 | 0 | 0.01 V | 10 |
| 0 | 0V | 1 | -3V | 0 | 0V | 1 | -3V | 1.77E+06 | 2 | 0 | 0.01 V | 11 |
| 0 | 0V | 1 | -3V | 0 | 0V | 0 | 0V | 1.68E+05 | 1 | 0 | 0.00 V | 12 |
| 0 | 0V | 0 | 0V | 1 | -3V | 1 | -3V | 2.31E+05 | 2 | 0 | 0.00 V | 13 |
| 0 | 0V | 0 | 0V | 1 | -3V | 0 | 0V | 1.23E+05 | 1 | 0 | 0.00 V | 14 |
| 0 | 0V | 0 | 0V | 0 | 0V | 1 | -3V | 1.07E+05 | 1 | 0 | 0.00 V | 15 |
| 0 | 0V | 0 | 0V | 0 | 0V | 0 | 0V | 8.49E+04 | 0 | 0 | 0.00 V | 16 |

| A. | | B. | | C$_{IN\text{-}}$ | | C$_{out+}$ | | C$_{out\text{-}}$ | | ~C$_{out\text{-}}$ | | Sum$_+$ | | Sum$_-$ | |
|---|---|---|---|---|---|---|---|---|---|---|---|---|---|---|---|
| 0 | 0.00V | 0 | 0.00V | 0 | 0.00 V | 0 | 0.00 V | 0 | 0.00 V | 1 | -3.00 V | 1 | 0.05 V | 0 | 0.00 V |
| 0 | 0.00V | 0 | 0.00V | 1 | -3.00 V | 0 | 0.00 V | 0 | 0.00 V | 1 | -3.00 V | 1 | 3.00 V | 1 | -3.00 V |
| 0 | 0.00V | 1 | -3.00V | 0 | 0.00 V | 0 | 0.00 V | 0 | 0.00 V | 1 | -2.95 V | 1 | 2.95 V | 1 | -3.00 V |
| 0 | 0.00V | 1 | -3.00V | 1 | -3.00 V | 1 | 2.95 V | 1 | -3.00 V | 0 | -0.05 V | 0 | 0.01 V | 0 | 0.00 V |
| 1 | -3.00V | 0 | 0.00V | 0 | 0.00 V | 0 | 0.05 V | 0 | 0.00 V | 1 | -2.95 V | 1 | 2.99 V | 1 | -3.00 V |
| 1 | -3.00V | 0 | 0.00V | 1 | -3.00 V | 1 | 2.95 V | 1 | -3.00 V | 0 | -0.05 V | 0 | 0.00 V | 0 | 0.00 V |
| 1 | -3.00V | 1 | -3.00V | 0 | 0.00 V | 1 | 2.99 V | 1 | -3.00 V | 0 | -0.01 V | 0 | 0.01 V | 0 | 0.00 V |
| 1 | -3.00V | 1 | -3.00V | 1 | -3.00 V | 1 | 3.00 V | 1 | -3.00 V | 0 | 0.00 V | 1 | 3.00 V | 1 | -3.00 V |

SYSTEM AND METHOD FOR THRESHOLD LOGIC WITH ELECTROSTATICALLY FORMED NANOWIRE TRANSISTORS

CROSS REFERENCE TO RELATED APPLICATION

This application claims the benefit of U.S. Provisional application Ser. No. 61/973,684, filed on Apr. 1, 2014, the disclosure of which is incorporated by reference herein in its entirety.

BACKGROUND

A transistor can regulate current or voltage flow and acts as a switch or gate for electrical signals. Transistors include a semiconductor material capable of carrying a current. A small change in the input current or voltage can produce a large change in the current passing through the transistor. The transistor can thus act as a switch, opening and closing an electronic gate many times per second. Transistors are basic elements in integrated circuits (ICs), which can use very large numbers of transistors interconnected with circuitry and baked into a single silicon microchip. Today's computers use circuitry dominated by complementary metal oxide semiconductor (CMOS) technology.

DETAILED DESCRIPTION

A threshold logic for electrostatically formed nanowire (EFN) transistors can utilize gates of EFN transistors to provide computing performance and efficiency improvements, e.g., over CMOS technology, as silicon (Si) transistor scaling approaches for computing reaching their inherent limits. In one example, four gates of EFN transistors can be used. By controlling the gates independently, efficient circuits can be realized using far fewer transistors than required by CMOS. The threshold logic can overcome the challenges of cascading logic stages so that the EFN transistors can be used to create complex circuits for computing devices. Threshold logic can be realized with the EFN transistor to provide a potential replacement for CMOS, or to be used in combination with CMOS, as a paradigm for a next generation of computing.

Figure 1:
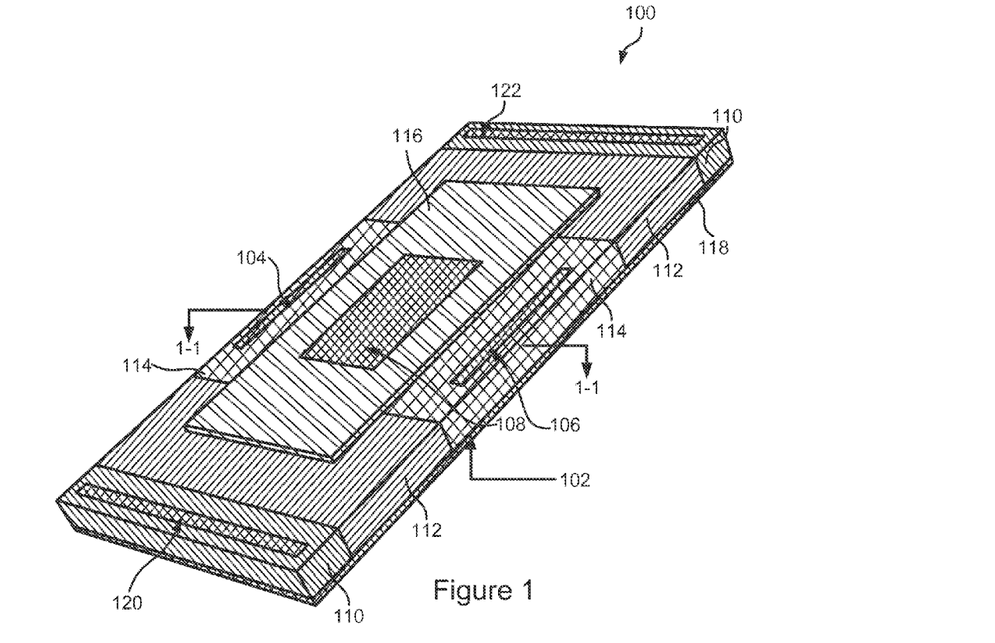
FIG. 1 is a three-dimensional perspective view of an exemplary electrostatically formed nanowire (EFN) transistor.
Figure 2:
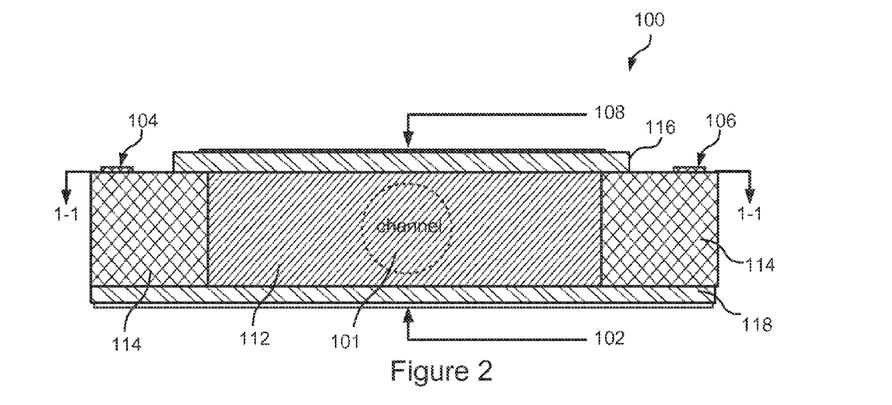
FIG. 2 is a cross-sectional end view along the centerline 1-1 of the exemplary EFN transistor of FIG. 1.

FIG. 1 is a three-dimensional perspective view of an exemplary EFN transistor 100, and FIG. 2 is a cross-sectional end view along centerline 1-1 of the exemplary EFN transistor 100. The EFN transistor 100 is based on a nanowire-like conducting channel 101 that in one example is not physically fabricated but electrostatically formed post EFN transistor 100 fabrication. An area and location of the channel 101 can be controlled by biasing four gates: a back gate (BG) 102, two lateral junction side gates (JG1) 104 and (JG2) 106 and a top/front gate (FG) 108. The gates 102, 104, 106, 108 are surrounded by a doped silicon region which can include N+ type silicon bodies 110, N− silicon bodies 112 and P+ silicon bodies 114. The side gates 104, 106, front gate 108 and the back gate 102 can be formed from a metal. The front gate 108 and the back gate 102 can be positioned on oxide layers 116, 118.

To perform binary logic, a source gate 120 and a drain gate 122 can be positioned on the N+ type silicon bodies 110 and the side gates 104, 106 positioned on P+ type silicon bodies. The source gate 120 and the drain gate 122 can be made of metal. Biasing of the various gates 102, 104, 106, 108 forms depletion regions at the gate-silicon interfaces and junctions around the N− type silicon body 112, forming a small accumulated conductive silicon region. The undepleted silicon region can be electrostatically shaped and controlled into the nano-wire like channel 101 of variable diameter. The EFN transistor 100 can be operated as a majority carrier device: by applying positive bias to the drain gate 122, the current flows from drain gate 122 to source gate 120 through the channel. The area and location of the channel 101 is controlled by biasing the four gates: the two side gates 104, 106, top gate 108 and the bottom gate 102; the width of the channel 101 is decreased by negative biasing of the two side gates 104, 106, while the top gate 108 and bottom gate 102 mainly control the height and vertical position of the channel 101.

The modulation of current through electrostatically formed nanowire-like channels 101 is controlled by the voltage on the four gates 102, 104, 106, 108. The threshold logic family leverages these unique capabilities that enable the efficient computation of complex logic functions. This behavior can be interpreted as a complex four-input switching process, enabling the computation of multiple-input threshold logic functions using a single device with about one-eighth the number of active logic devices and one-quarter the number of transistors required by CMOS. The EFN transistors 100 can be used for switching and/or amplification, etc.

Figure 3:
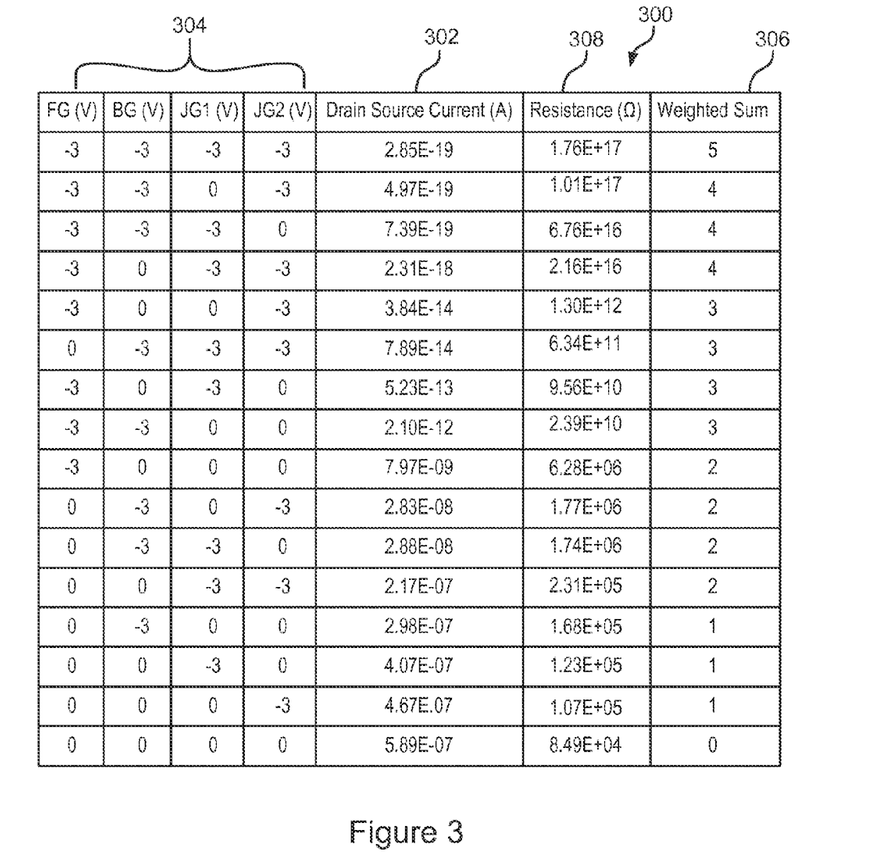
FIG. 3 is a chart showing an exemplary drain-source current through the EFN transistor for combinations of binary input voltages.

FIG. 3 is a chart 300 showing an exemplary drain-source current 302 through the EFN transistor 100 for combinations of binary input voltages. The drain-source voltage in this example is about 50 mV. To perform binary logic, a switching device demonstrates a clear differentiation between the "on" and "off" states. The simulation data in FIG. 3, sorted by the drain-source current 302 through the electrostatically formed nanowire EFN transistors 100, show a large ratio between the highest and lowest currents. Furthermore, there is a ratio greater than $10^3$ between the drain-source currents in the neighboring states 304 (−3, −3, 0, 0) and (−3, 0, 0, 0). States 304 are represented by the combination of four input voltages FG 108, BG 102, JG1 104, and JG2 106, respectively. Currents above this gap can be determined as "on" states, and currents below this gap as "off" states. This is therefore a symmetric device with eight "off" states, e.g., top eight rows of FIG. 3, and eight "on" states, bottom eight rows of FIG. 3.

The range of input voltages for the EFN transistor 100 is non-overlapping with the range of gate output voltages in order to prevent forward-biasing of EFN p-n junction. The circuits discussed below use binary voltages determined as: binary '1' is equivalent to voltages near +3 V or −3 V and binary '0' is equivalent to voltages near 0 V.

Unlike conventional Boolean logic gates, switching in threshold logic gates can be based on the comparison of a weighted sum 306 of binary inputs to a specified threshold value. The operation of the EFN transistor 100 discussed above can be considered an inverse threshold switching device with the following specifications: the back (bottom) gate 102 and the side junction gates 104, 106 each have a weight of 1; the front (top) 108 gate has a weight of 2; the device threshold is 3; the device is "off" when the sum of the inputs is greater than or equal to the threshold; the device is "on" when the sum of the inputs is less than the threshold. The threshold operation is made clear in the weighted sum 306 column of FIG. 3. The eight "off" states have weighted sums greater than or equal to 3, and the eight "on" states have weighted sums less than 3. FIG. 3 also illustrates the example resistance 308 for each state.

Figure 4:
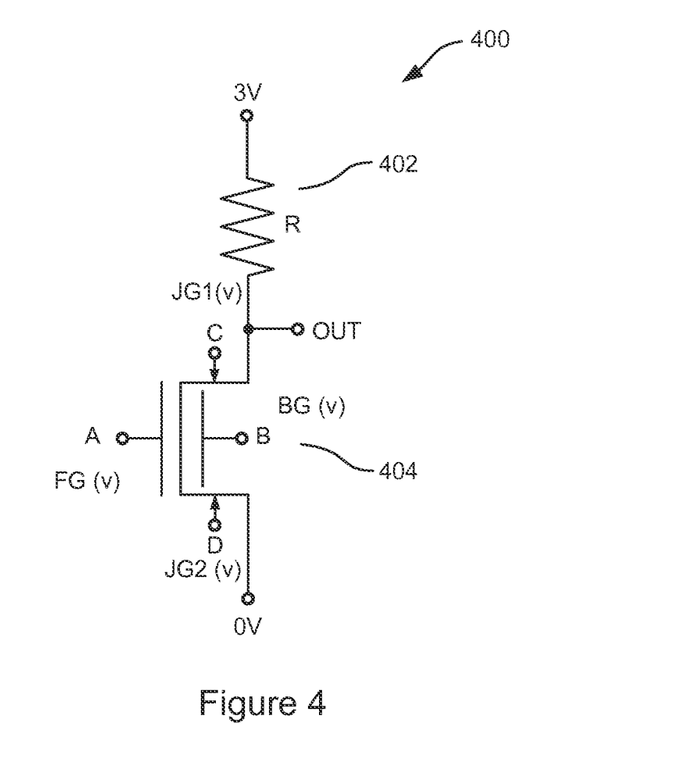
FIG. 4 is an exemplary circuit diagram of an EFN threshold logic gate act s as a load.

FIG. 4 is an exemplary circuit diagram of an EFN transistor 100 threshold logic gate 400. The logic gate 400 is a voltage divider between the resistor 402 and EFN transistor 404 with an example high voltage of 3 V and low output voltage of 0 V to ensure that the EFN p-n junction gates 108 (A), 102 (B), 104(C), 106 (D) are never forward-biased. In other examples, a pull-up device other than the resistor 402 can be used, e.g., a transistor. Example inputs range from −3 V to 0 V. The value of the resistor 402 is chosen to be about $3.87 \times 10^8 \Omega$, the geometric mean between the resistance of the most conductive "off" state and least conductive "on" state. Therefore, the OUT voltage has two possible states: between about 2.95 V and 3 V when the EFN transistor 100 is in the "off" state; between 0 V and 0.05 V when the EFN transistor 100 is in the "on" state. With the state definitions described above, this is a (positive, non-inverting) threshold logic gate 400 with three single-weighted inputs, one double-weighted input, and a threshold of 3.

Figure 5:
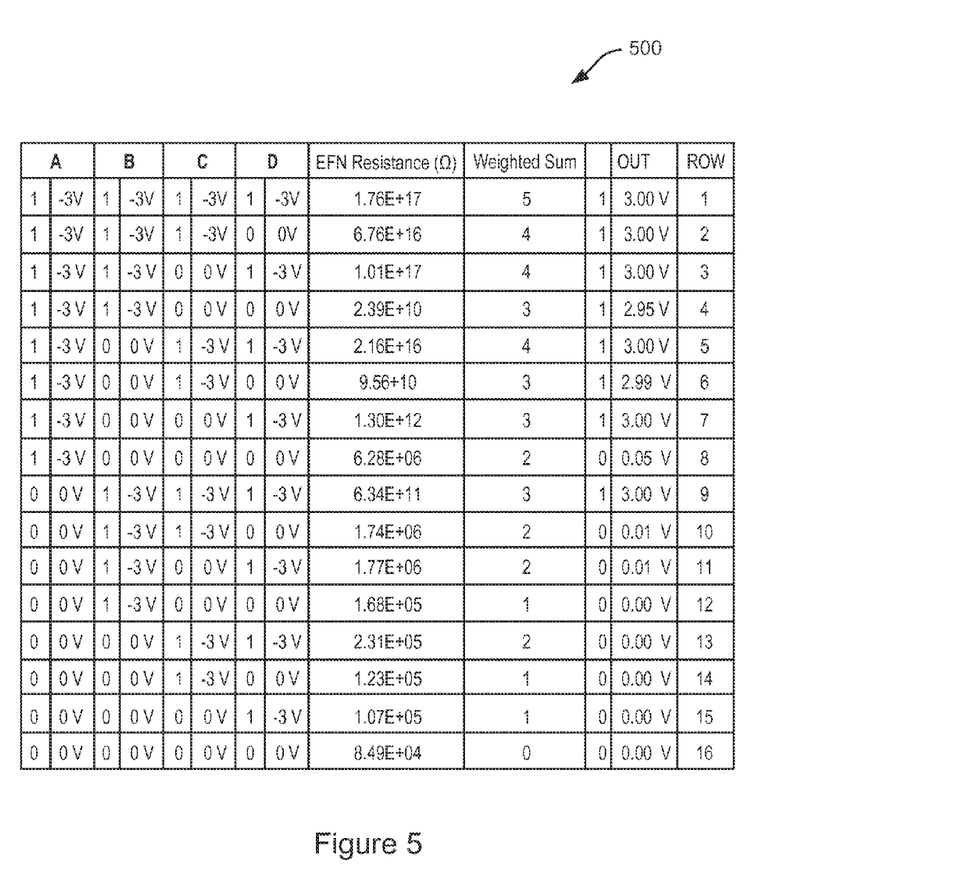
FIG. 5 is an exemplary truth table for the circuit in FIG. 4.

FIG. 5 is an exemplary truth table 500 for the circuit in FIG. 4, with both voltages and binary logic values. Rows 1-7 and 9 show a high output voltage, and rows 8 and 10-16 show a low voltage output.

Figures 6, 7:
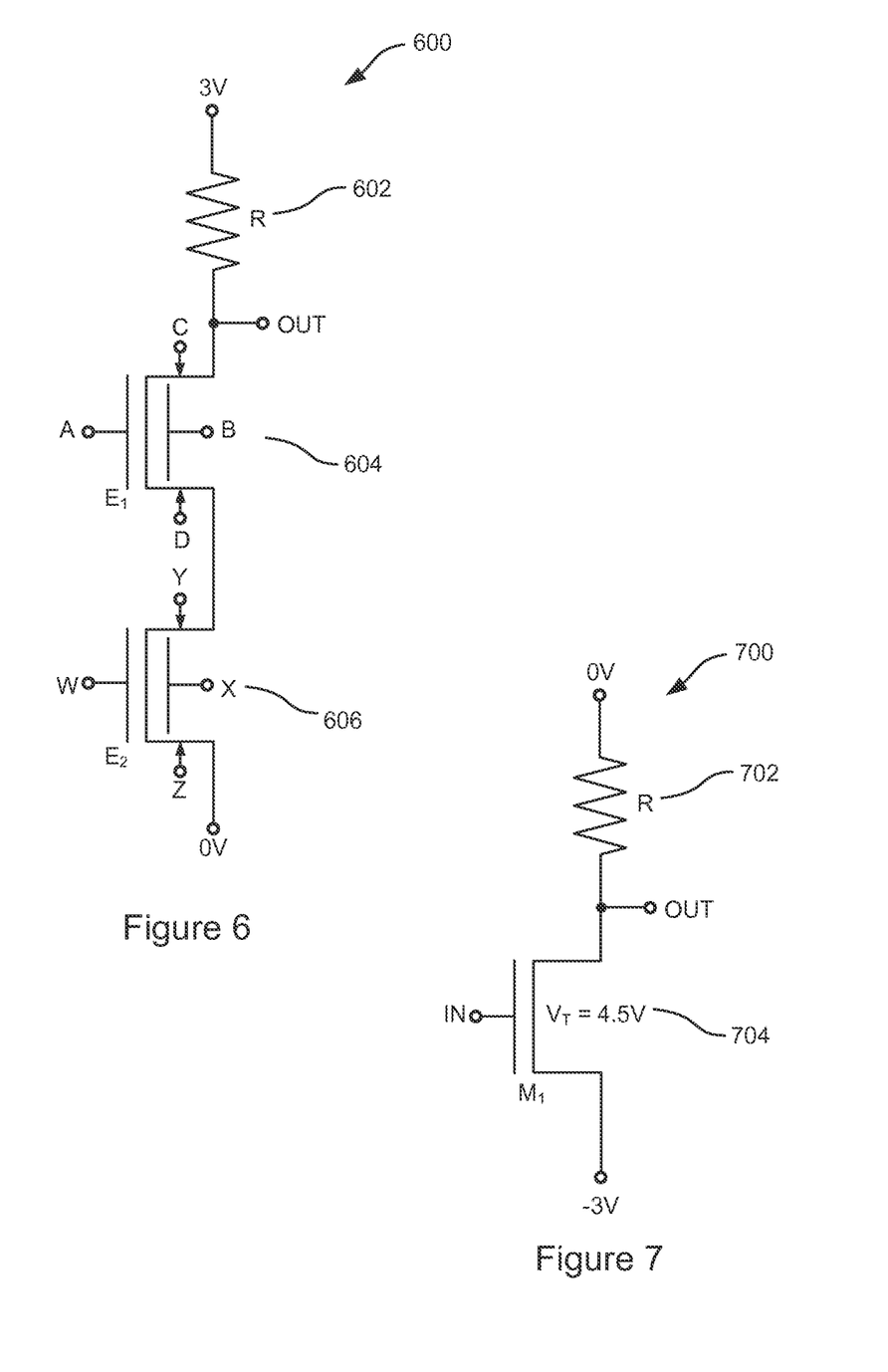
FIG. 6 is an exemplary circuit diagram of a multiple-input threshold logic stage with series combination of EFN transistors.
FIG. 7 is an exemplary circuit diagram of a non-inverting level shifter for the EFN transistor, using an NMOS transistor.

FIG. 6 is an exemplary circuit diagram of a multiple input threshold logic stage 600 with a resistor 602 in series with combination of EFN transistors 604, 606. Increased logic density can be achieved by multiple EFN transistors 604, 606 in parallel and/or in series. For example, two threshold logic gates are shown in series in FIG. 6, allowing for a function of up to eight inputs (A, B, C, D, W, X, Y, Z) within a single stage. Multiple parallel EFN transistors 100 can also be used, as can complex networks of parallel and series EFN transistor 100. This can allow for the use of fewer EFN transistors 100 and logic stages, resulting in reduced power dissipation and increased performance.

A cost may be in terms of the output voltage range. For the logic stage shown in FIG. 6 and the $3.87 \times 10^8 \Omega$ resistor 602, the highest '0' output results from both EFN transistors 604, 606 in the (−3, 0, 0, 0) state and the lowest '1' output results from the (−3, −3, 0, 0) state, providing an example reduced output range of 0.09 V to 2.98 V. The noise margins can be made symmetric by changing the resistor value, increasing the resistance for series EFN transistors 100 and decreasing the resistance for parallel EFN transistors 100. A degradation of the output voltage range is analogous to conventional CMOS circuits. With careful circuit design, the use of parallel and series EFN transistors 100 can provide a significant increase in computational efficiency.

As the output voltages are not in the same range as the input voltages, the voltage levels are shifted to cascade gates. This can be achieved with voltage divider stages including a conventional NMOS transistor and a resistor that create an output between −3 V and 0 V. As discussed, the logical '1' can be represented by a voltage of −3 V or 3 V, and the logical '0' represented by a voltage of 0 V. The cascading structure addresses the voltage mismatch between the inputs and the outputs of the gates of EFN transistors 100 inherent to electrostatically formed nanowire channels 101, to enable the design of circuits larger than one stage of logic. Voltage shifters allow for cascaded logic gates and large-scale integration. The modulation of current through electrostatically formed nanowire channels 101 is controlled by the voltage on the four input gates 102, 104, 106, 108. Other amounts of input gates can be used. Applications for the threshold logic with EFN transistors 100 includes high performance computing, general-purpose computing, mobile computing, low power computing, compact computing, etc. Advantages include one or more of a potential for higher computing efficiency, the ability to exploit four independent transistor gates as opposed to one in conventional CMOS, compact circuits, e.g., less area, fewer devices, and lower cost, lower power, higher speed, and circuits that are tolerant to process variations.

FIG. 7 is an exemplary circuit diagram of a non-inverting level shifter 700 for the EFN transistor 100. A voltage divider including a resistor 702 and NMOS transistor 704 can operate between 0 V and −3 V. Other operating voltages can be used depending on an implementation. In this example circuit, the NMOS voltage threshold is set to the shift in the low voltages plus half the range of the input circuit. As the low voltage shift is from 0 V to −3 V, and the range of the input circuit is from 0 V to 3 V, the NMOS voltage threshold VT is set to 4.5 V. If the input is 0 V, VGS=3 V, which is less than VT, it causes the NMOS transistor to be off and OUT=0 V. If the input is 3 V, VGS=6 V, it causes the NMOS transistor to be on and OUT=−3 V.

Figure 8:
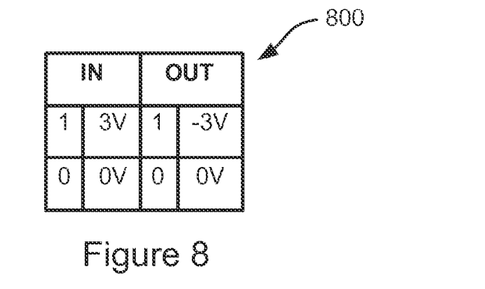
FIG. 8 is a chart of an exemplary truth table for the non-inverting level-shifter of FIG. 7.

FIG. 8 is a chart of an exemplary truth table 800 for the non-inverting level-shifter 700 of FIG. 7. In both cases above, the binary output value is equivalent to the binary input value, as shown in FIG. 8.

Figure 9:
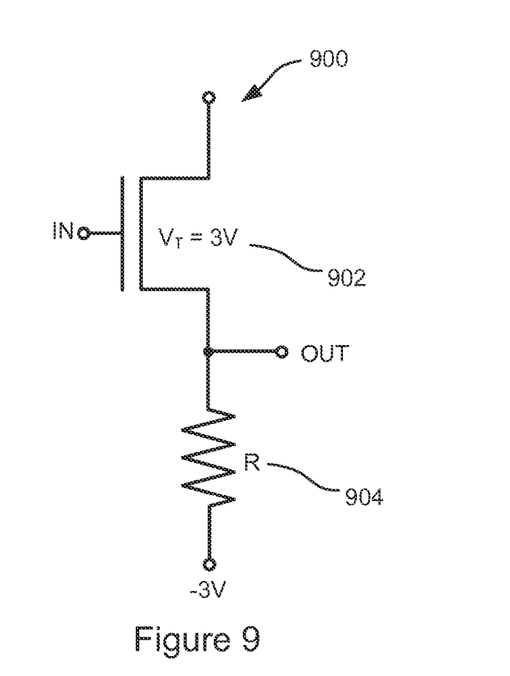
FIG. 9 is a circuit diagram of an exemplary inverting level-shifter for an EFN transistor using NMOS transistor.

FIG. 9 is a circuit diagram of an exemplary inverting level-shifter 900 for an EFN threshold logic. The inverting level shifter 900 is similar to the non-inverting level shifter 800, a differences being the different VT value and swapped NMOS transistor 902 and resistor 904 positions. The NMOS threshold voltage is set to the desired voltage drop from the input to the output.

Figure 10:
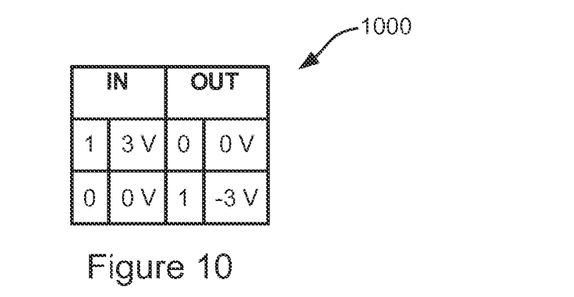
FIG. 10 is a chart of an exemplary truth table for the inverting level-shifter of FIG. 9.

FIG. 10 is a chart of an exemplary truth table 1000 for the inverting level-shifter of FIG. 9.

Figure 11:
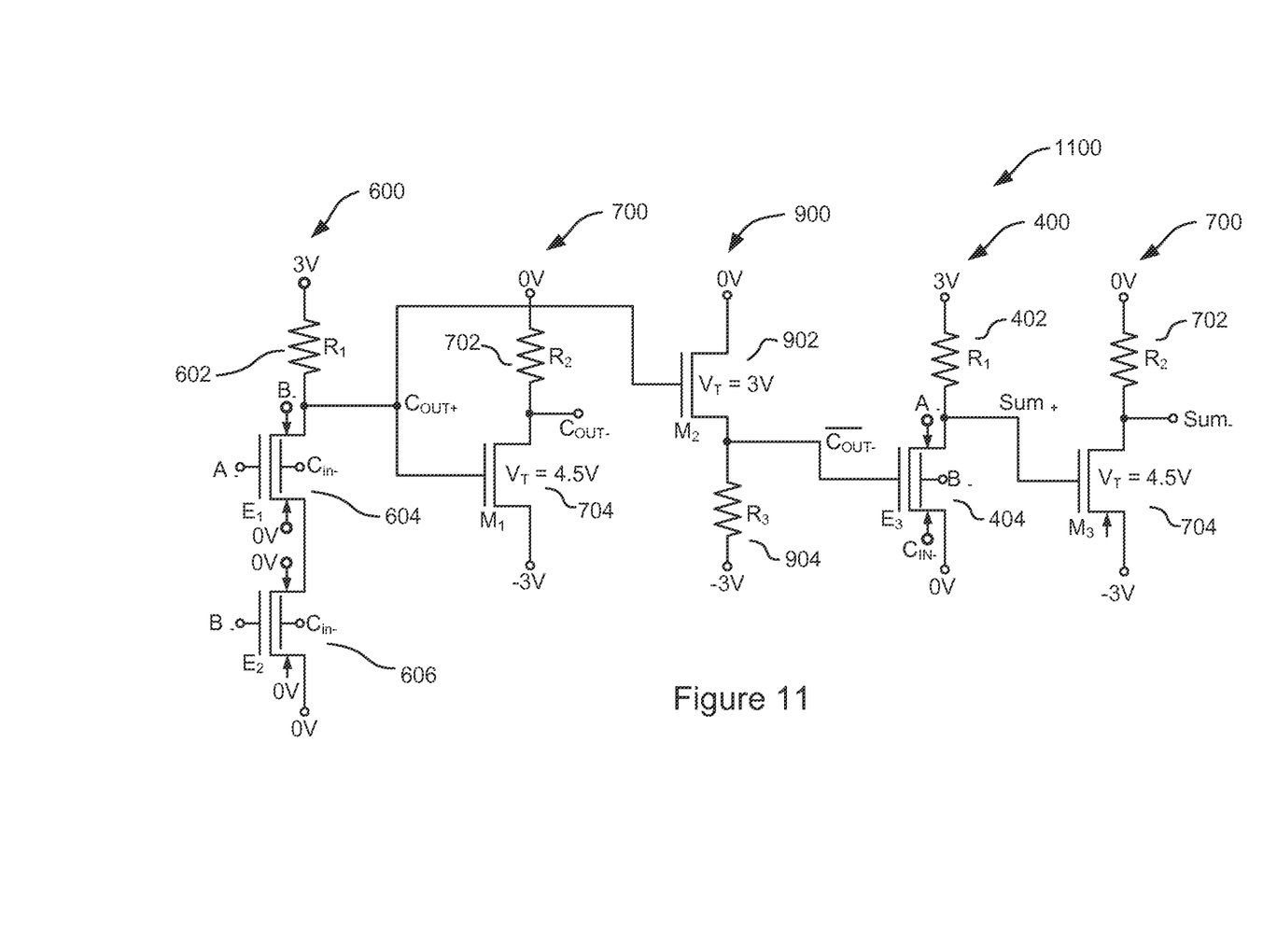
FIG. 11 is an exemplary one bit full adder circuit diagram implemented by EFN threshold logic.

FIG. 11 is an exemplary circuit diagram of a full adder 1100 implemented by EFN threshold logic. An output of the input threshold logic stage 600 can be an input to the non-inverting level shifter 700 and the inverting level-shifter 900, which are connected in series. An output of the inverting level-shifter 900 can be an input to the threshold logic gate 400 to output Sum+. Sum+ can be input to the non-inverting level shifter 700 to output Sum−. Therefore, complex logic functions can be achieved using EFN threshold logic gates 102, 104, 106, 108 in concert with the level shifters discussed above. The full adder 1100 computes the binary sum and carry-out produced by the addition of two binary digits and a carry-in. A−, B−, and CIN− as inputs, and COUT− and Sum− as outputs. Nodes are labeled with + or − to demarcate, respectively, a voltage range (and logic assignment) between 0 V (logic '0') and 3 V (logic '1') or between −3 V (logic '1') and 0 V (logic '0') respectively. Other voltages may be used. As an example, Sum+ and Sum− are logically equivalent but have opposite voltage ranges. There are two threshold logic stages, one containing the EFN devices labeled E1 and E2 in series, and the other containing E3. There are two non-inverting level shifters with conventional NMOS transistors labeled M1 and M3, and one inverting level shifter labeled M2.

Figure 12:
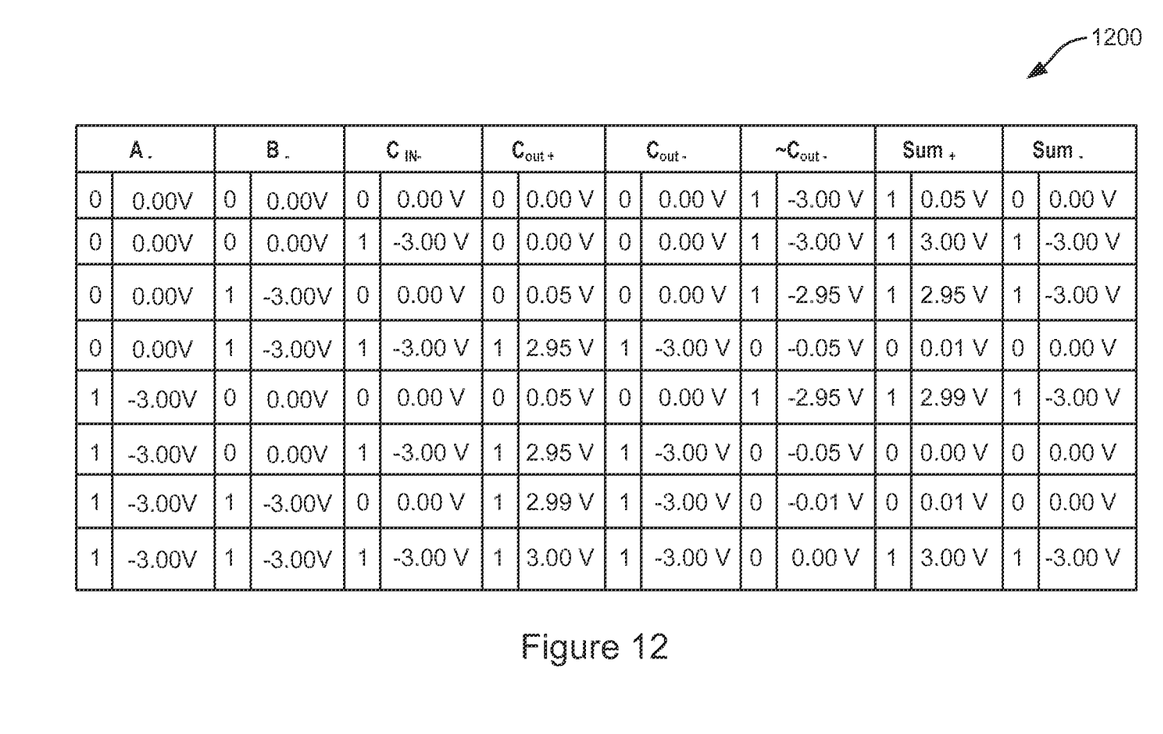
FIG. 12 is a chart of an exemplary truth table for the full adder circuit of FIG. 11.

FIG. 12 is a chart of an exemplary truth table 1200 for the full adder circuit of FIG. 11, including intermediate node voltages. This circuit computes the full adder function with three active logic devices and six total transistors 404, 604, 606, 704, 704, 904, more compact than the twenty eight transistors in conventional CMOS. Other amounts of active logic devices and transistors can be used depending on an implementation.

This EFN threshold logic family can provide increased logic efficiency compared to CMOS. While a NMOS and PMOS transistor are used for each input to a CMOS function, each EFN transistor 100 has only four input gates 102, 104, 106, 108. Therefore, the computation of a function with EFN threshold logic requires one-eighth the number of EFN devices as transistors required by CMOS. This approximation can be valid when comparing optimized best-case functions as well as in the general case.

The characteristics of the EFN transistors 100 and the use of resistors and level shifters can affect the efficiency to some degree. The EFN transistors 100 may have increased switching times and leakage currents. The resistors consume area, and their use results in static power dissipation. The level shifters add to the power consumption and delay and use additional NMOS transistors, resulting in a total of six transistors for the full adder in FIG. 11. If the impact of these concerns is sufficiently small, improvements in area, power dissipation, and performance will make this EFN threshold logic family a viable technology to replace CMOS for general-purpose computing.

The circuits discussed above consider fabrication difficulty and performance and are appropriate for an initial investigation into this logic family. Several modifications are possible. Different voltage values: +3 V and −3 V are not necessary high and low voltages. Furthermore, there is no requirement that the voltage ranges of the logic and level shifting circuits be equivalent. For example, there can be a voltage range of 0 V to 1 V for the EFN threshold logic circuits and a voltage range of −3 V to 0 V for the level shifting circuits. Single type of level shifter: the use of both the non-inverting and inverting level shifter circuits can enable increased logical efficiency. Fabrication difficulties or other challenges might make it worthwhile to use only a single type of level shifter. In this case, the circuits can be modified and there can be an increased number of logic stages and devices. Depletion-mode transistors: the resistors can be replaced by depletion-mode transistors with VGS=0 V, which can allow for increased performance and decreased area. In other implementations, the use of discrete resistors can be sufficient. Pull-down networks: the pull-down networks can include individual EFN and NMOS devices. These devices can be replaced by multiple series/parallel devices to perform more compact logic. This can come at the cost of decreased signal integrity. EFN modifications: it can be optimal to modify the EFN parameters or dimensions such that a different logical function, threshold or otherwise, is performed. P-type EFN: the use of a P-type EFN can curtail a need for level shifters. Differential cascade voltage switch logic (DCVSL): the static power dissipation can be eliminated through the use of a structure similar to DCVSL, which can increase the circuit area.

Figure 13:
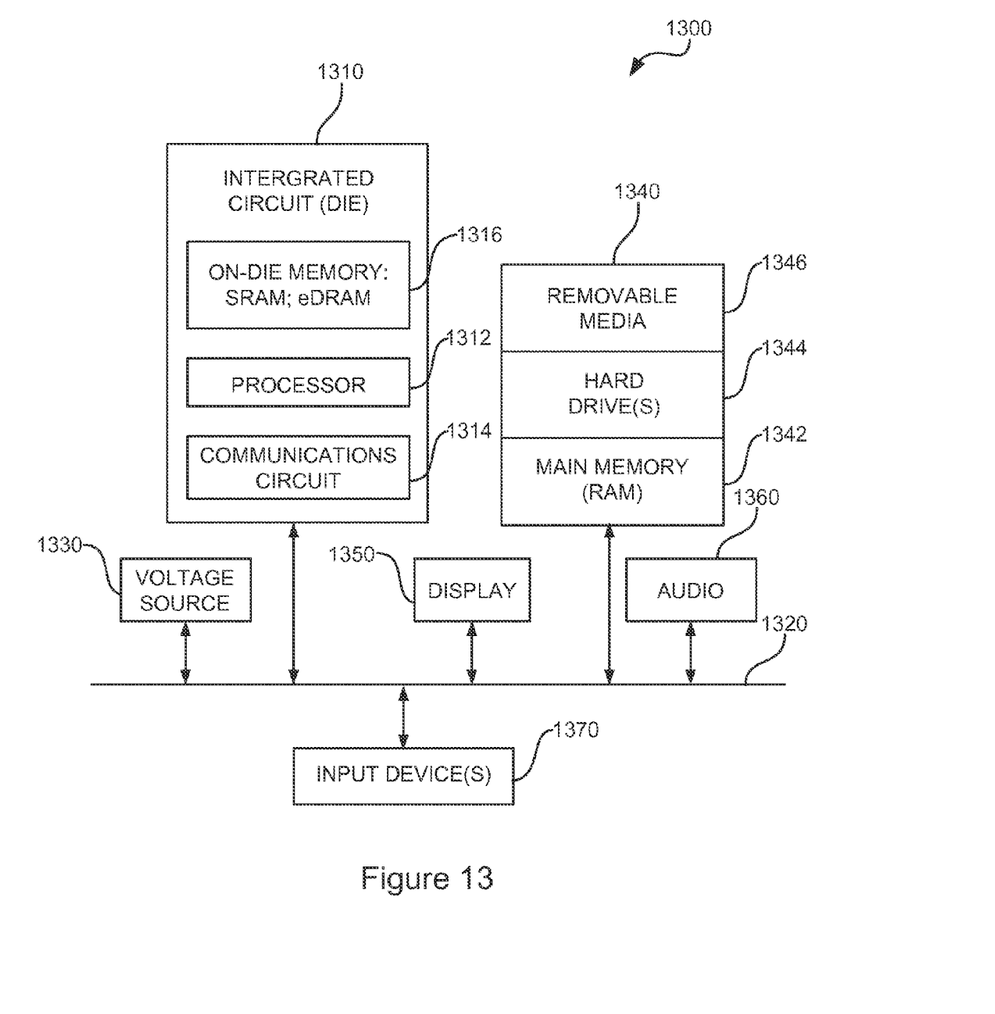
FIG. 13 is a schematic of an exemplary electronic system that can utilize the EFN transistors.

FIG. 13 is a schematic of an exemplary electronic system 1300 that can utilize the EFN transistors. The electronic system 1300 as depicted can embody the EFN transistors as set forth in this disclosure. In an embodiment, the electronic system 1300 is a computer system that includes a system bus 1320 to electrically couple the various components of the electronic system 1300. The system bus 1320 is a single bus or any combination of busses according to various embodiments. The electronic system 1300 includes a voltage source 1330 that provides power to the integrated circuit 1310. In some embodiments, the voltage source 1330 supplies current to the integrated circuit 1310 through the system bus 1320.

The integrated circuit 1310 is electrically coupled to the system bus 1320 and includes any circuit, or combination of circuits according to an embodiment. In an embodiment, the integrated circuit 1310 includes a processor 1312 that can be of any type. As used herein, the processor 1312 may mean any type of circuit such as, but not limited to, a microprocessor, a microcontroller, a graphics processor, a digital signal processor, or another processor. Other types of circuits that can be included in the integrated circuit 1310 are a custom circuit or an ASIC, such as a communications circuit 1314 for use in wireless devices such as cellular telephones, pagers, portable computers, two-way radios, and similar electronic systems. In an embodiment, the processor 1310 includes on-die memory 1316 such as SRAM. In an embodiment, the processor 1310 includes on-die memory 1316 such as eDRAM.

In an embodiment, the electronic system 1300 also includes an external memory 1340 that in turn may include one or more memory elements suitable to the particular application, such as a main memory 1342 in the form of RAM, one or more hard drives 1344, and/or one or more drives that handle removable media 1346, such as diskettes, compact disks (CDs), digital video disks (DVDs), flash memory keys, and other removable media.

In an embodiment, the electronic system 1300 also includes a display device 1350, an audio output 1360. In an embodiment, the electronic system 1300 includes a controller 1370, such as a keyboard, mouse, trackball, game controller, microphone, voice-recognition device, or any other device that inputs information into the electronic system 1300.

The integrated circuit 1310 can be implemented in a number of different embodiments, including an electronic package, an electronic system, a computer system, one or more methods of fabricating an integrated circuit, and one or more methods of fabricating an electronic assembly that includes the integrated circuit and the EFN transistors and circuits as set forth herein in the various embodiments and their equivalents. The elements, materials, geometries, dimensions, and sequence of operations can all be varied to suit particular packaging requirements.

Implementations include a transistor including a source, a drain, and gates surrounding a doped silicon region; the gates including a top gate, a bottom gate, and side gates; the gates inducing a channel in said doped silicon region; and the channel having a width which is decreased by negative biasing of the side gates, and a height and vertical position controlled by the top and bottom gates. The controlled gates can include four independently controlled gates. The channel can include an electrostatically formed nanowire channel. The silicon region can include a n-doped silicon region and/or a p-doped silicon region. The transistor can be configured to enable a complex four-input switching process and the computation of multiple input threshold logic functions using a single device. The transistor can be configured to operate as a majority carrier device, with current flowing from drain to source through an electrostatically formed nanowire by applying positive bias to the drain. The transistor can be configured to show a ratio between highest and lowest drain-source currents of greater than 1000, applying binary voltages of about 3V to one or more of the control gates leading to eight 'on' states and eight 'off' states. The transistor can be configured to perform threshold logic operations based on the comparison of a weighted sum of binary inputs to a specified threshold value, with the bottom and side gates having a weight of 1, the top gate having a weight of 2, and a device threshold of 3.

A threshold logic gate includes an electrostatically formed nanowire transistor; a resistor; an output terminal between transistor and resistor; and supply voltage terminals at the opposite ends of the resistor and transistor. Supply voltages can be set to ensure that the electrostatically formed nanowire p-n junction gates are never forward biased. Inputs can range from about −3V to about 0V. Input voltages can be interpreted as logical '0' and '1' values, e.g., with a '1' input voltage of about −3V and '0' input voltage of about 0 V. A resistor value can be chosen to be a geometric mean between the resistance of the transistor's most conductive 'off' state and least conductive 'on' state. A high supply voltage can connect to the resistor and a low supply voltage connected to the transistor. An output voltage can be close to the high supply voltage when the transistor is in its resistive "off" state and an output voltage close to the low supply voltage when the transistor is in its conductive "on" state. An output voltage close to the high supply voltage can be interpreted as a logical '1' and an output voltage close to the low supply voltage interpreted as a logical '0'. An output '1' voltage includes about 2.95 to 3V and output '0' of about 0 to 0.05V. The electrostatically formed nanowire transistor can be replaced by a network of electrostatically formed nanowire transistors. The network of electrostatically formed nanowire transistors can include two electrostatically formed nanowire transistors in series. The network of electrostatically formed nanowire transistors can include two electrostatically formed nanowire transistors in parallel. The network of electrostatically formed nanowire transistors can include a combination of series and parallel electrostatically formed nanowire transistors. The logic gate can include more than four input voltages. A resistor value can be chosen to be a geometric mean between the resistance of the transistor network's most conductive 'off' state and least conductive 'on' state. Input voltages in one range of are shifted to another range.

A circuit includes a transistor; a resistor; an output terminal between transistor and resistor; and supply voltage terminals at the opposite ends of the resistor and transistor.

A range of input voltages can be higher than the range of output voltages. For example, the range of input values is 0 V to 3 V and the range of output values is −3 V to 0 V. Binary '1' and '0' voltages can be determined for both ranges. For example, an input of 3 V is determined as a '1' and 0 V is determined as a '0', and in which an output of −3 V is determined as a '1' and 0 V is determined as a '0'. The binary output value is equivalent to the binary input value to perform the function of a non-inverting level-shifter. An output voltage of −3 V is in response to an input voltage of 3 V and an output voltage of 0 V in response to an input of 0 V. The binary output value can be opposite to the binary input value to perform the function of an inverting level-shifter. An output voltage of 0 V can be in response to an input voltage of 3 V and an output voltage of −3 V in response to an input of 0 V.

A method for computing binary logic functions includes electrostatically formed nanowire transistor logic gates as described with any of the circuits above. The outputs of the electrostatically formed nanowire transistor logic gates can be used as inputs to the level shifting circuits, and the outputs of the level shifting circuits used as the inputs to the electrostatically formed nanowire transistor logic gates.

While various embodiments have been described, it can be apparent that many more embodiments and implementations are possible. Accordingly, the embodiments are not to be restricted.

What is claimed is:

1. A threshold logic gate, comprising:
an electrostatically formed nanowire transistor, where the electrostatically formed nanowire transistor includes multiple input gates to control a flow of current;
a pull-up device;
an output terminal between the electrostatically formed nanowire transistor and the pull-up device; and
supply voltage terminals at opposite ends of the pull-up device and the electrostatically formed nanowire transistor, where the multiple input gates are configured to switch the electrostatically formed nanowire transistor based on a comparison of a weighted sum of binary input voltages to a threshold value which results in at least one of less area, lower power, or higher speed.

2. The threshold logic gate of claim 1, where the pull-up device comprises a resistor or a transistor.

3. The threshold logic gate of claim 1, comprising supply voltages set to ensure that a p-n junction of the electrostatically formed nanowire are never forward biased.

4. The threshold logic gate of claim 1, comprising input voltages interpreted as logical 0 and logical 1 values.

5. The threshold logic gate of claim 4, comprising a logical 1 input voltage of about −3V and logical 0 input voltage of about 0 V.

6. The threshold logic gate of claim 1, comprising a pull-up device resistance value chosen to be a geometric mean between a resistance of a most conductive off state and least conductive on state of the electrostatically formed nanowire transistor.

7. The threshold logic gate of claim 1, comprising a high supply voltage connected to the pull-up device and a low supply voltage connected to the electrostatically formed nanowire transistor.

8. The threshold logic gate of claim 1, where the electrostatically formed nanowire transistor comprises a network of electrostatically formed nanowire transistors.

9. A threshold logic gate, comprising:
an output terminal positioned between an electrostatically formed nanowire transistor and a pull-up device; and a high voltage terminal at an opposite end of the pull-up device and a low voltage terminal at an opposite end of the electrostatically formed nanowire transistor, where the electrostatically formed nanowire transistor includes multiple input gates to control a flow of current, where a voltage at the output terminal determines an off state and an on state, and where the multiple input gates are configured to switch the electrostatically formed nanowire transistor based on a comparison of a weighted sum of binary input voltages to a threshold value which results in at least one of less area, lower power, or higher speed.

10. The threshold logic gate of claim 9, where the pull-up device comprises a resistor or a transistor.

11. The threshold logic gate of claim 9, comprising supply voltages set to ensure that a p-n junction of the electrostatically formed nanowire are never forward biased.

12. The threshold logic gate of claim 9, where the off state comprises about 2.95 volts to 3 volts, and the on state comprises about zero volts to 0.05 volts.

13. The threshold logic gate of claim 9, comprising a pull-up device resistance value chosen to be a geometric mean between a resistance of a most conductive off state and least conductive on state of the electrostatically formed nanowire transistor.

14. The threshold logic gate of claim 9, comprising a high supply voltage connected to the pull-up device and a low supply voltage connected to the electrostatically formed nanowire transistor.

15. The threshold logic gate of claim 9, where the electrostatically formed nanowire transistor comprises a network of electrostatically formed nanowire transistors.

16. The threshold logic gate of claim 9, where electrostatically formed nanowire transistor includes four biased gates.

17. The threshold logic gate of claim 16, where the four biased gates are surrounded by a doped silicon region.

18. The threshold logic gate of claim 16, where three of the four biased gates are single weighted and one of the four biased gates is double weighted.

* * * * *